(12) United States Patent
Li et al.

(10) Patent No.: US 8,184,897 B2
(45) Date of Patent: May 22, 2012

(54) METHOD AND APPARATUS FOR DETERMINING AN OPTICAL THRESHOLD AND A RESIST BIAS

(75) Inventors: Jianliang Li, Hillsboro, OR (US); Lawrence S. Melvin, III, Hillsboro, OR (US); Qiliang Yan, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 855 days.

(21) Appl. No.: 12/244,178

(22) Filed: Oct. 2, 2008

(65) Prior Publication Data

US 2010/0086196 A1    Apr. 8, 2010

(51) Int. Cl.
*G06K 9/00*    (2006.01)

(52) U.S. Cl. ........ 382/145; 382/147; 382/141; 382/286; 382/291

(58) Field of Classification Search .................. 382/145, 382/147, 149, 141, 27, 286, 291
See application file for complete search history.

(56) References Cited

U.S. PATENT DOCUMENTS

| 4,890,239 A | 12/1989 | Ausschnitt |
| 7,266,800 B2 * | 9/2007 | Sezginer ........................ 716/52 |
| 7,707,539 B2 * | 4/2010 | Huang et al. .................. 382/144 |
| 2007/0032896 A1 | 2/2007 | Ye |
| 2008/0044739 A1 | 2/2008 | Konomi |

* cited by examiner

*Primary Examiner* — Gregory J Toatley
*Assistant Examiner* — Iyabo S Alli
(74) *Attorney, Agent, or Firm* — Park, Vaughan, Fleming & Dowler LLP; Laxman Sahasrabuddhe (57) ABSTRACT

One embodiment of the present invention provides techniques and systems for determining modeling parameters for a photolithography process. During operation, the system can receive a layout. Next, the system can determine an iso-focal pattern in the layout. The system can then determine multiple aerial-image-intensity values in proximity to the iso-focal pattern by convolving the layout with multiple optical models, wherein the multiple optical models model the photolithography process's optical system under different focus conditions. Next, the system can determine a location in proximity to the iso-focal pattern where the aerial-image-intensity values are substantially insensitive to focus variations. The system can then use the location and the associated aerial-image-intensity values to determine an optical threshold and a resist bias. The optical threshold and the resist bias can then be used for modeling the photolithography process.

20 Claims, 6 Drawing Sheets

METHOD AND APPARATUS FOR DETERMINING AN OPTICAL THRESHOLD AND A RESIST BIAS

FIELD OF THE INVENTION

The present invention generally relates to electronic design automation. More specifically, the present invention relates to methods and apparatuses for determining an optical threshold and a resist bias for a photolithography process.

BACKGROUND

Related Art

Rapid advances in computing technology can largely be attributed to improvements in semiconductor manufacturing technologies which have made it possible to integrate tens of millions of devices onto a single chip.

Process models are commonly used to model semiconductor manufacturing processes. A process model can be used in a number of applications during the design of a semiconductor chip. For example, process models are commonly used for making corrections to layouts to compensate for undesirable effects of semiconductor manufacturing processes.

Inaccuracies in the process model can negatively affect the efficacy of applications which use these models. For example, inaccuracies in a photolithography process model can reduce the efficacy of optical proximity correction (OPC). At higher integration densities, inaccuracies in conventional resist models may limit the efficacy of applications which use process models. Hence, it is desirable to determine accurate process models by accurately modeling resist behavior.

SUMMARY

One embodiment of the present invention provides systems and techniques for determining parameters for a photolithography process which can be used to accurately model the photolithography process. Specifically, an embodiment provides systems and techniques to determine an optical threshold and a resist bias for a photolithography process.

Empirical data for a photolithography process is usually obtained by measuring the critical dimensions of features on the wafer, and hence, the empirical data incorporates both optical effects as well as resist effects. One embodiment of the present invention provides systems and techniques to separate the resist effects from the optical effects so that the empirical data can be used to determine a more accurate photolithography model.

The system can determine an iso-focal pattern by: printing a layout under different focus conditions, measuring the critical dimensions of the printed patterns, and identifying a pattern whose critical dimension measurements are substantially insensitive to focus variations.

The iso-focal pattern can then be used to determine an optical threshold and a resist bias. Specifically, multiple optical models can be used to determine aerial-image-intensity values in proximity to the iso-focal pattern, wherein the multiple optical models model the photolithography process's optical system under different focus conditions. Next, the system can determine a location in proximity to the iso-focal pattern where the aerial-image-intensity values are substantially insensitive to focus variations. The system can then use the aerial-image-intensity values at that location to determine the optical threshold. Further, the system can determine an optical critical-dimension by determining a distance between the location and a reference location.

The system can then determine the resist bias by determining a difference between the resist critical-dimension, i.e., the critical dimension measurement of the iso-focal feature as printed on the wafer, and the optical critical-dimension which was determined by using the optical models. The optical threshold and the resist bias can then be used to determine an accurate photolithography process model.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
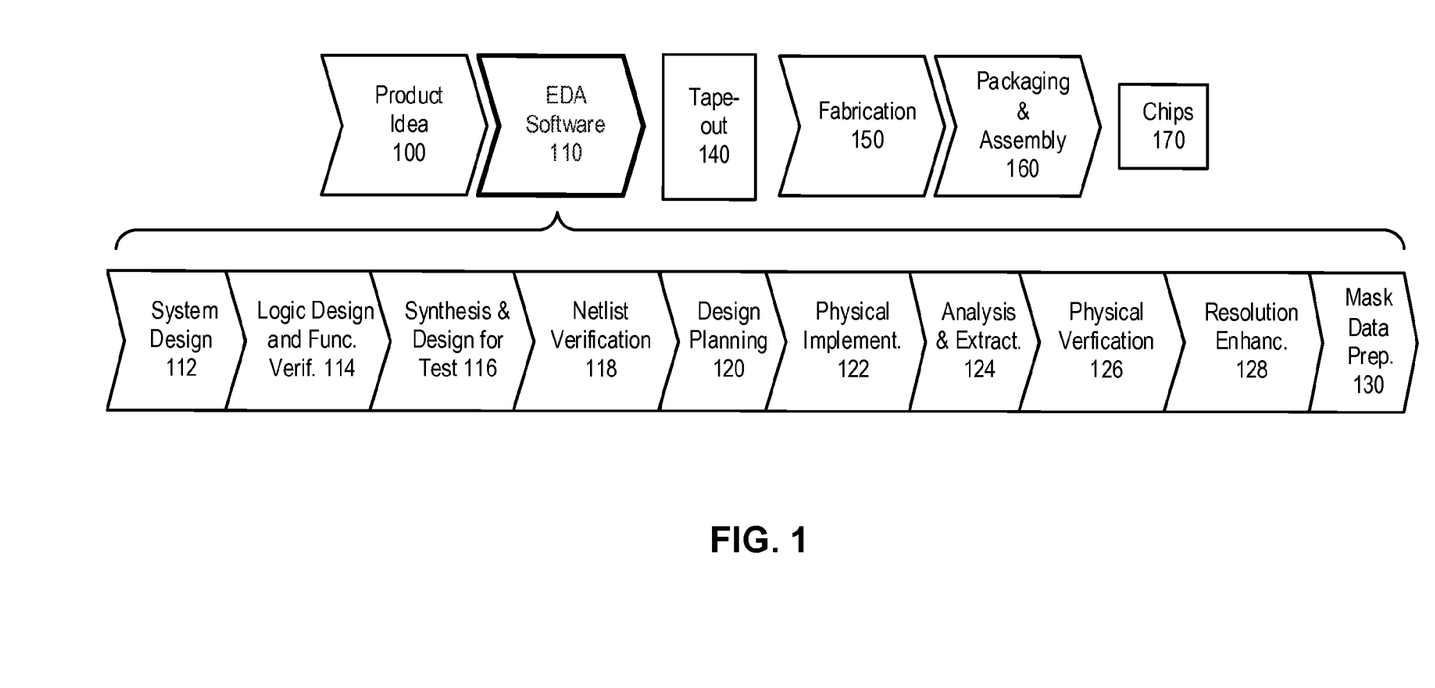
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process usually starts with a product idea (step 100) which is realized using an EDA process (step 110). Once the design is finalized, it is usually taped-out (event 140) and goes through the fabrication process (step 150) and packaging and assembly processes (step 160) to produce the finished chips (result 170).

The EDA process (step 110) comprises steps 112-130, which are described below for illustrative purposes only and are not meant to limit the present invention. Specifically, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare®.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda®.

Synthesis and design for test (step 116): The VHDL/Verilog can be translated to a netlist in this stage. The netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS®.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include Astro™ and IC Compiler products.

Analysis and extraction (step 124): At this stage, the circuit function is verified at a transistor level; this, in turn, permits what-if refinement. Exemplary EDA software products from Synopsys, Inc. that can be used at this step include AstroRail™, PrimeRail, PrimeTime®, and Star-RCXT™.

Physical verification (step 126): In this step, the design is checked to ensure correctness for manufacturing, electrical issues, lithographic issues, and circuitry. Exemplary EDA software products from Synopsys, Inc. that can be used at this step includes Hercules™.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen.

Mask data preparation (step 130): This step provides the "tape-out" data for production of masks to produce finished chips. Exemplary EDA software products from Synopsys, Inc. that can be used at this step include the CATS® family of products.

Process Models

A process model models the behavior of one or more semiconductor manufacturing processes which usually involve complex physical and chemical interactions. A process model can be determined by fitting or calibrating kernel coefficients to empirical data. The empirical data is usually generated by applying the semiconductor manufacturing processes that are being modeled to one or more test layouts. For example, a photolithography process can be used to print a test layout on a wafer. Next, the empirical data can be obtained by measuring the critical dimensions (CD) of the features. An uncalibrated process model can then be fit to the empirical data to obtain a calibrated process model that models the photolithography process.

Once a process model is determined, it can be used in a number of applications during the design and manufacture of a semiconductor chip. For example, process models are typically used to support optical proximity correction (OPC) and resolution enhancement technologies (RET). These models can allow full-chip database manipulation in reasonable timeframes during the tape-out flow.

An uncalibrated process model typically includes components that are associated with parameters and/or coefficients. During calibration, the parameters and/or coefficients can be statistically fit to empirical data to obtain the final process model. A component in the process model is typically a mathematical expression that is designed to model a particular physical effect. For example, a process model may be represented as $$\sum_i (c_i \cdot k_i),$$

where $k_i$ is a component or kernel, and $c_i$ is a coefficient which is associated with $k_i$. The empirical data may include values of a desired property, e.g., the CD, at different locations in the layout. Once the process model is fit to the empirical data, it can then be used to predict the value of the desired property for other layouts.

It may be impossible to calibrate coefficient values so that the predicted data exactly matches the empirical data. Even if an exact fit was available, it may not be desirable because the resulting process model may not interpolate and/or extrapolate properly. Typically, statistical fitting techniques are used to determine the parameters and/or coefficients so that the error between the empirical data and the predicted data is minimized. In one embodiment, the system can use a least squares fitting technique to determine the parameter and/or coefficient values.

A process model is considered to be robust if it interpolates and extrapolates well, i.e., if the process model generates accurate results when it is applied to layouts that are different from the layouts that were used during the fitting process. In general, the fewer modeling functions or kernels that a process model uses, the more robust it is. However, using fewer kernels may decrease the process model's accuracy. Hence, there is usually a tradeoff between the robustness and the accuracy of a process model.

Photolithography Process Models

Process models can be determined using statistical modeling and/or physical modeling. Statistical modeling techniques typically use general purpose modeling functions with coefficients and/or parameters which are fit to empirical data. Note that the functions used by a statistical model are usually not based on the workings of the underlying physical processes; instead, they are modeling functions of general applicability which can be used to fit any kind of empirical data.

In contrast to statistical modeling, physical modeling tries to model the underlying physical processes. For example, a physical model for a photolithography process will typically include an optical model and a resist model. The optical model may model the optical system which is used to expose the resist, and the resist model may model the behavior of the resist when it is exposed to radiation.

Optical Model

The optical model in a photolithography process model is usually based on the Hopkins model which models the behavior of partially coherent optical systems.

Figure 2:
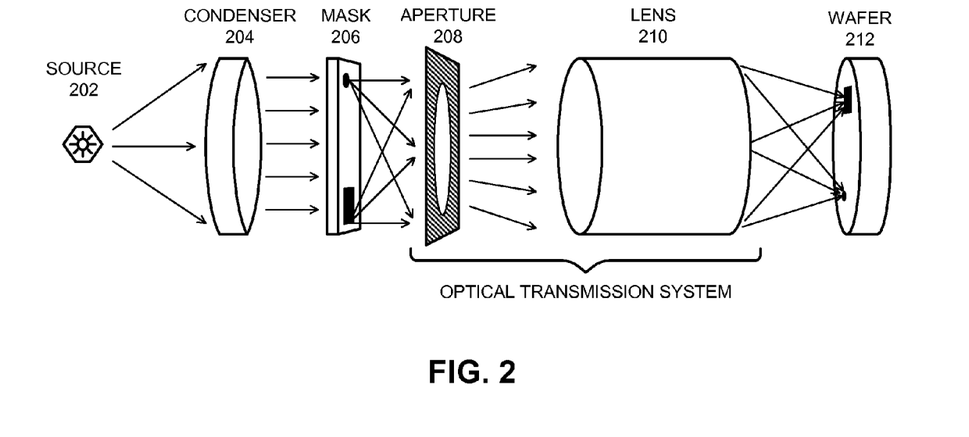
FIG. 2 illustrates a typical optical system in accordance with an embodiment of the present invention.

FIG. 2 illustrates a typical optical system in accordance with an embodiment of the present invention.

Radiation from source 202 can be collimated by a condenser 204. The collimated light can then pass through mask 206, aperture 208, lens body 210, and form an image on a wafer 212.

The Hopkins model can be described using the expression:

$$I(x,y) = \iiiint J(x',y';x'',y'') \otimes L(x,y;x',y') \otimes L^*(x,y;x'',y'') dx'dy'dx''dy'',$$

where, $I(x, y)$ is the optical intensity at point $(x, y)$ on the wafer, $L(x,y; x',y')$ is a lumped model of the light source and the mask, $L^*$ is the complex conjugate of $L$, and $J(x',y'; x'',y'')$ models the incoherence between two points of light on the mask. The lumped model $(L)$ essentially treats the mask as an array of light sources. In particular, $L(x,y; x',y')$ models point $(x',y')$ on the mask as a point source, and $J(x',y'; x'',y'')$ models the incoherence between the light emanating from points $(x',y')$ and $(x'',y'')$ on the mask. The lumped model $(L)$ can be represented as a convolution between the mask and the source. For example, the lumped model can be represented using a mask model and a source model as follows:

$$L(x,y;x',y') = M(x',y') \otimes K(x,y;x',y'),$$

where $M(x',y')$ models the mask and $K(x,y; x',y')$ models the source.

The Hopkins model can be used to determine a 4-D (four dimensional) matrix called the transmission cross coefficient (TCC) matrix which models the optical system. The TCC matrix can then be represented using a set of orthogonal 2-D (two dimensional) kernels. The set of orthogonal kernels can be determined using the eigenfunctions of the TCC matrix. The features on the wafer can be determined by convolving the set of 2-D kernels with the mask. General information on photolithography and process modeling can be found in Alfred Kwok-Kit Wong, *Optical Imaging in Projection Microlithography*, SPIE-International Society for Optical Engine, 2005, and Grant R. Fowles, *Introduction to Modern Optics*, $2^{nd}$ Edition, Dover Publications, 1989.

In one embodiment, the system can use a set of orthogonal functions called Zernike polynomials to represent the optical system. Zernike polynomials are made up of terms that are of the same form as the types of aberrations often observed in optical systems. For example, one Zernike polynomial may be associated with defocus, while another may be associated with tilt, etc. The optical system can be represented using the expression $$\sum_i (c_i \cdot z_i),$$

where $z_i$ is a Zernike polynomial and $c_i$ is an optical coefficient which is associated with $z_i$.

The foregoing descriptions of a photolithography process model have been presented only for purposes of illustration and description. They are not intended to be exhaustive or to limit the present invention to the forms disclosed. Accordingly, many modifications and variations will be apparent to practitioners skilled in the art.

Resist Model

As feature sizes become smaller, the accuracy of process models becomes increasingly critical. In general, physical models are usually preferred over statistical models because physical models tend to be more accurate and robust than statistical models. Conventional photolithography models use a physical modeling approach to model the optical system, but they use a statistical modeling approach to model the resist's behavior. Specifically, conventional modeling techniques usually change the resist parameters in the model by either moving the "optical image" or responding differently to varying image qualities. As integration densities increase, the resist model's inaccuracies are expected to become significant. Hence, there is a need to improve the accuracy of resist models.

During process model calibration, an uncalibrated process model is fit to empirical data. The empirical data for a photolithography process model is obtained by measuring the critical dimensions of features on the wafer. However, note that the critical dimension of a feature on the wafer incorporates the optical system's behavior as well as the resist's behavior. In other words, the empirical data that is typically used for modeling photolithography processes does not separate the optical effects from the resist effects. If we don't have empirical data which specifically captures the resist effects, then it can be very difficult, if not impossible, to model resist effects accurately.

The optical threshold and the resist bias are two parameters which can be useful for creating an accurate physical model for the resist. The optical threshold can be defined as the intensity level that causes the resist material to change its characteristics by an amount that is sufficient to cause a pattern to print on the wafer. The resist bias can be defined as the change in the critical dimension of a feature during the chemical and physical processes that are used in a photolithography process after the wafer's surface has been exposed to radiation.

Note that the optical model is usually very accurate; hence, the aerial-image intensity at any point on the wafer's surface can be determined with a high degree of accuracy. However, since the optical threshold is not known, we cannot determine with a high degree of accuracy the regions of the resist whose characteristics have changed enough so that patterns will print on the wafer's surface.

One embodiment of the present invention uses the following insight: if we know the optical threshold, we can determine the resist bias by computing a difference between the critical dimensions as measured on the wafer's surface and the "optical critical-dimensions" which can be defined as the theoretical critical dimensions which exist after the resist is exposed but before further physical and chemical processes are applied to the wafer's surface.

Note that it is impractical to directly measure the optical threshold. However, one embodiment of the present invention determines the optical threshold by determining the aerial image intensity of an iso-focal pattern under different focus conditions. Specifically, the embodiment uses the following insights: (1) for a fixed dose, if the aerial image is iso-focal, then the corresponding printed pattern will also be iso-focal, and vice versa, and (2) the aerial-image intensity at an edge of an iso-focal pattern remains substantially the same when focus conditions are varied. Hence, if we can identify an iso-focal pattern, then we can determine the optical threshold by determining the "intersection point" of the aerial-image intensity curves under different focus conditions.

Figure 3:
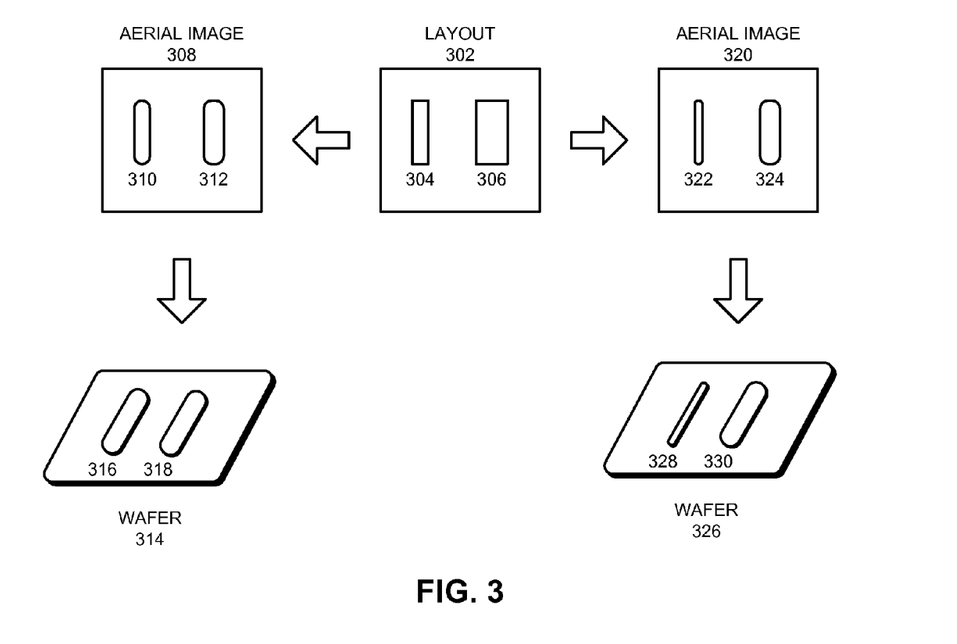
FIG. 3 illustrates an iso-focal pattern in accordance with an embodiment of the present invention.

FIG. 3 illustrates an iso-focal pattern in accordance with an embodiment of the present invention. Note that the patterns shown in FIG. 3 are for illustration purposes only and are not intended to be representative of the patterns that are used in an actual photolithography process.

Layout 302 includes patterns 304 and 306. Exposing layout 302 under a particular focus condition results in aerial image 308 which includes aerial-image patterns 310 and 312. For a clear field mask, the aerial-image pattern usually corresponds to a region on the wafer where the aerial-image intensity is less than the optical threshold. On the other hand, for a dark field mask, an aerial-image pattern usually corresponds to a region on the wafer where the aerial-image intensity is greater than the optical threshold. After further processing, patterns 316 and 318 can be printed on wafer 314.

Changing the focus conditions usually changes the critical dimension of the aerial-image patterns and the resulting printed patterns. For example, aerial image 320 can be obtained by exposing layout 302 under a focus condition that is different from the focus condition that gave rise to aerial image 308. Even though aerial-image patterns 310 and 322 were generated from the same layout pattern, the critical dimensions of aerial-image patterns 310 and 322 are quite different, and the critical dimensions of printed patterns 316 and 328 on wafers 314 and 326, respectively, are also quite different.

Iso-focal patterns are substantially insensitive to variations in focus conditions. For example, pattern 306 is an iso-focal pattern because the corresponding aerial-image patterns 312 and 324 are substantially similar to one another even though they were generated under different focus conditions. Furthermore, since the aerial-image patterns are substantially similar, the resulting printed patterns on the wafer are also expected to be substantially similar, and vice versa. For example, the printed patterns 318 and 330 are also substantially similar to one another.

Note that the critical dimension of an iso-focal pattern may or may not match the critical dimension of the corresponding pattern on the layout. For example, even though pattern 306 is an iso-focal pattern, the aerial-image pattern 312, and the printed pattern 318 are thinner than pattern 306 on the layout.

Figure 4:
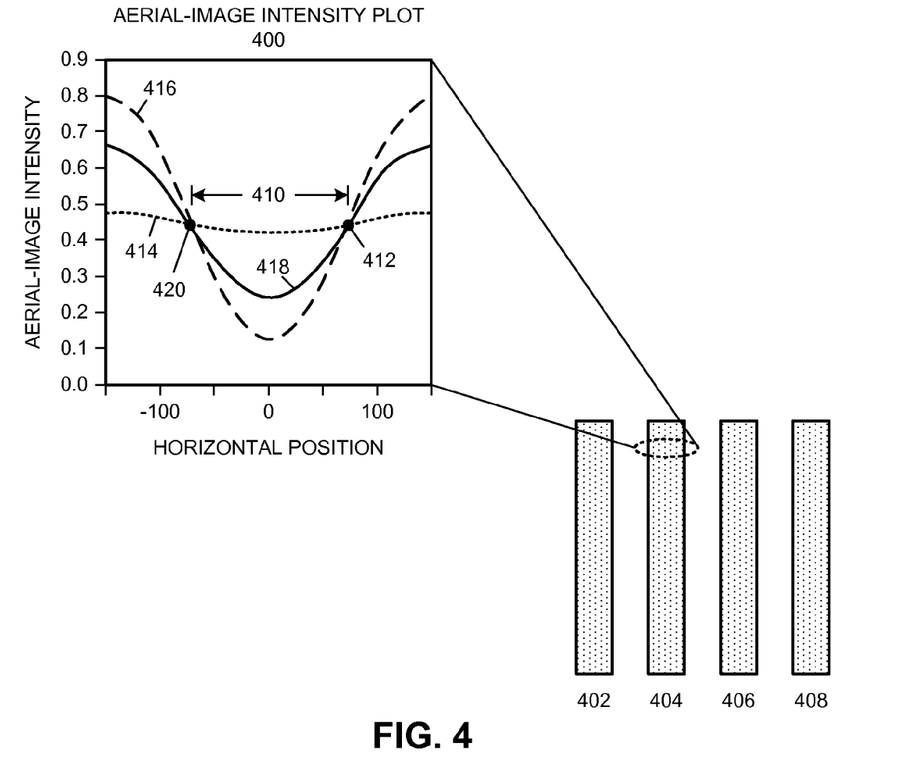
FIG. 4 illustrates why an iso-focal pattern is substantially insensitive to focus variations in accordance with an embodiment of the present invention.

FIG. 4 illustrates why an iso-focal pattern is substantially insensitive to focus variations in accordance with an embodiment of the present invention.

Lines 402, 404, 406, and 408 can be part of a layout. Without loss of generality, we can assume that we are using a positive photoresist and a clear field mask to expose the layout. Hence, a pattern will print if the aerial-image intensity is less than the optical threshold. Specifically, the optical system model can be used to determine the aerial-image intensity at a location on the wafer. Next, the aerial-image intensity can be compared with the optical threshold to determine whether the pattern will print at that location or not.

Aerial-image intensity plot 400 illustrates the variation of the aerial-image intensity across the width of line 404. It will be evident that a constant optical threshold can be represented by a horizontal line in plot 400 (not shown for the sake of clarity). In plot 400, the optical threshold line would intersect an aerial-image intensity curve at two points, e.g., the optical threshold line may intersect curve 418 at points 412 and 420. Distance 410 between these two intersection points corresponds to the printed line width for line 404. If this line width is deemed to be a critical dimension, then distance 410 will be a critical dimension measurement for line 404.

Note that the aerial-intensity curves are usually different under different focus conditions. For example, aerial-intensity curves 414, 416, and 418 represent the aerial-image intensity under different focus conditions.

One embodiment of the present invention uses the following insight: if we have an iso-focal pattern, the aerial-intensity curves for different focus conditions should intersect at the same point, and this point should be on the optical threshold line. In other words, we can determine the optical threshold by determining the intersection point of the aerial-intensity curves that correspond to different focus conditions. For example, in plot 400, if line 404 is an iso-focal pattern, then the aerial-intensity value that is associated with intersection point 412 will be equal to the optical threshold.

Note that, in practice, the pattern may not be perfectly iso-focal, and even if the pattern is perfectly iso-focal, the different aerial-intensity curves may not intersect exactly at the same point. However, the intersection points of the curves will most likely still be very close to one another. In such situations, the optical threshold can be determined by using the optical threshold values that are associated with the set of intersection points. For example, the optical threshold can be determined by selecting one of the intersection points, and then determining the aerial-image intensity value associated with the selected intersection point. Alternatively, the optical threshold can be determined by determining a statistic, e.g., an average, of the optical threshold values that are associated with the set of intersection points.

Figure 5:
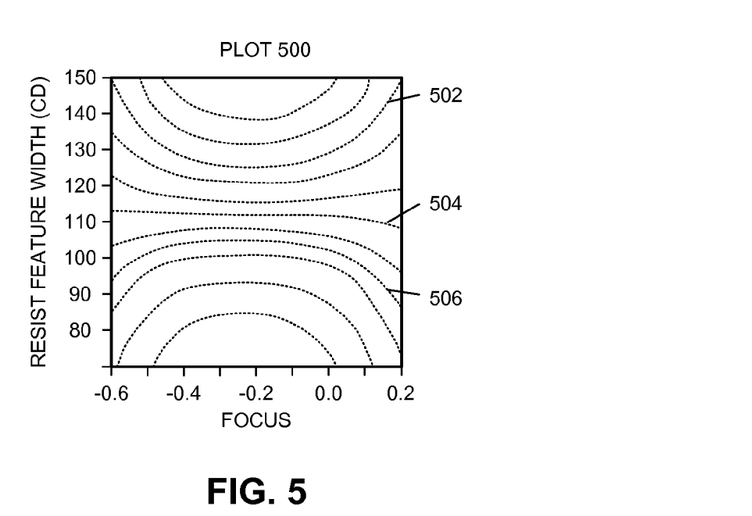
FIG. 5 illustrates the effect of dosage on an iso-focal pattern in accordance with an embodiment of the present invention.

FIG. 5 illustrates the effect of dosage on an iso-focal pattern in accordance with an embodiment of the present invention.

An iso-focal pattern usually exhibits iso-focal behavior at a particular dosage (which is the amount of radiation energy used for exposure). However, if the dosage is changed, the pattern may not exhibit iso-focal behavior. Each curve in plot 500 plots the critical dimension of a pattern (e.g., the resist feature width) against the focus for a particular dosage value. Note that iso-focal behavior will manifest itself as a substantially horizontal line in the plot. For example, curve 504 corresponds to the dosage at which the pattern exhibits iso-focal behavior. However, at a lower or a higher dosage, the pattern may generate curves 502 and 506, respectively, which do not correspond to iso-focal behavior because curves 502 and 506 are not substantially horizontal lines.

Based on the above discussion, the following sections describe systems and techniques for determining an optical threshold and a resist bias.

Process for Determining an Optical Threshold

Figure 6:
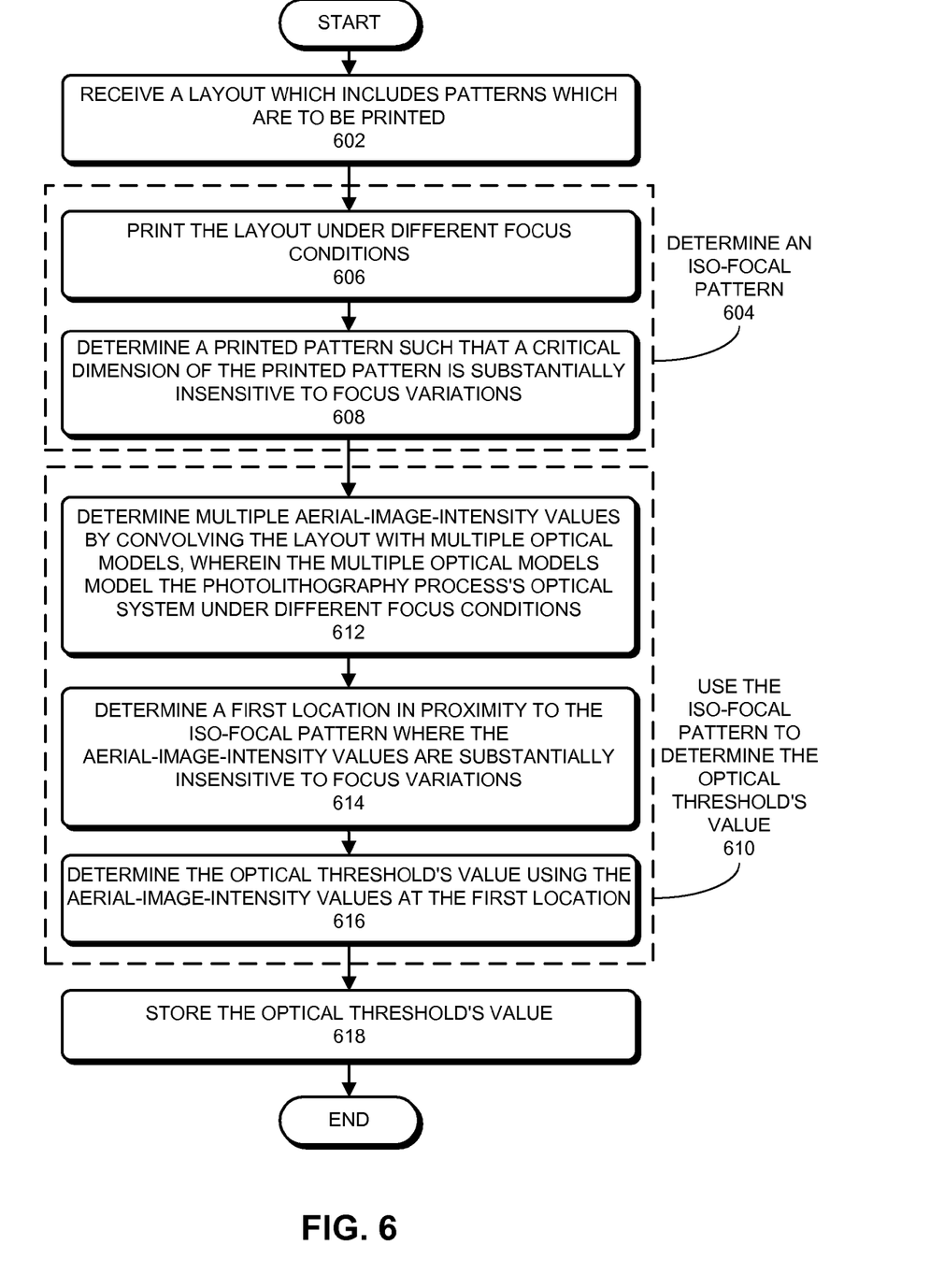
FIG. 6 presents a flow chart that illustrates a process for determining an optical threshold in accordance with an embodiment of the present invention.

FIG. 6 presents a flow chart that illustrates a process for determining an optical threshold in accordance with an embodiment of the present invention.

The process can begin by receiving a layout which includes patterns which are to be printed (step 602).

Next, the system can determine an iso-focal pattern (step 604). Specifically, the system can print the layout under different focus conditions (step 606). Next, the system can determine a printed pattern such that a critical dimension of the printed pattern is substantially insensitive to focus variations (step 608).

The patterns in the layout can be specifically designed to identify an iso-focal pattern. For example, the layout can have line-and-space patterns that have varying line widths and pitches. By printing the line-and-space patterns with different line widths and pitches, we can identify the line width value and the pitch value that gives rise to an iso-focal line-and-space pattern.

The system can then use the iso-focal pattern to determine the optical threshold's value (step 610). Specifically, the system can determine multiple aerial-image-intensity values by convolving the layout with multiple optical models, wherein the multiple optical models model the photolithography process's optical system under different focus conditions (step 612). Next, the system can determine a first location in proximity to the iso-focal pattern where the aerial-image-intensity values are substantially insensitive to focus variations (step

614). The system can then determine the optical threshold's value using the aerial-image-intensity values at the first location (step 616). Next, the system can store the optical threshold's value (step 618).

Convolution of the layout and the process model can be performed at any evaluation point in the layout. The evaluation point can be any location in the layout where we are interested in predicting the effect of the photolithography process. For example, the evaluation point may be located on a line-end, and we may be interested in determining whether the line-end will print properly.

The convolution is usually performed by convolving, at the evaluation point, a 2-D function that represents the layout with the process model. Note that process models typically have an ambit, and hence, the convolution operation usually does not require the system to convolve the entire layout with the process model; instead, the system only needs to convolve the portion of the layout that falls within the ambit.

The value of the convolution can then be used to determine the effect of the photolithography process at the evaluation point. For example, the system can convolve the layout with the process model at multiple evaluation points in the layout, and compare the convolution values with a threshold to determine a contour which represents the shape of the printed pattern.

Process for Determining a Resist Bias

Figure 7:
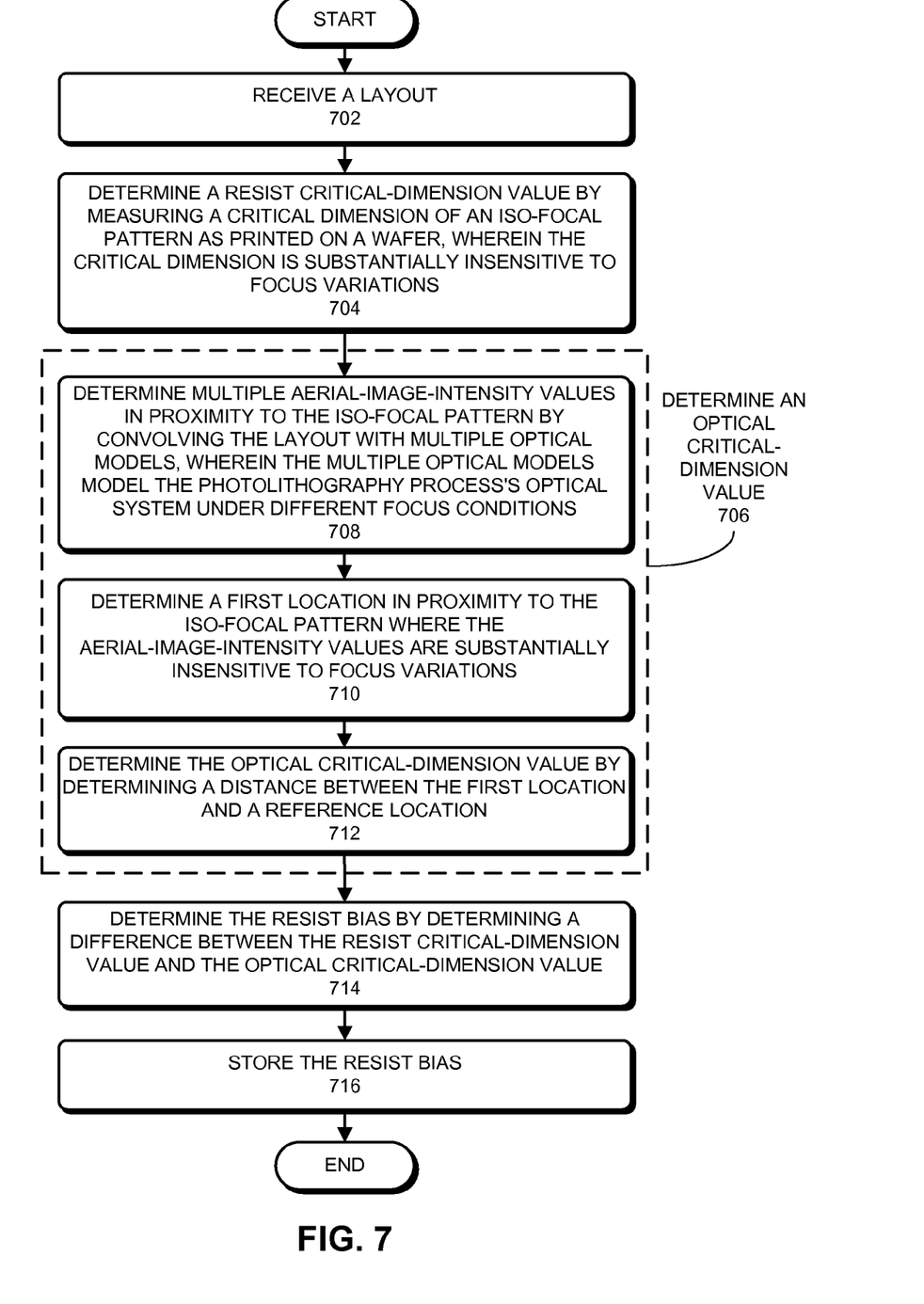
FIG. 7 presents a flow chart that illustrates a process for determining a resist bias in accordance with an embodiment of the present invention.

FIG. 7 presents a flow chart that illustrates a process for determining a resist bias in accordance with an embodiment of the present invention.

The process can begin by receiving a layout (step 702).

Next, the system can determine a resist critical-dimension value by measuring an iso-focal pattern's critical dimension as printed on a wafer, wherein the iso-focal pattern's critical dimension is substantially insensitive to focus variations (step 704).

As explained above, the system can identify an iso-focal pattern in the layout by: printing the layout under different focus conditions to obtain printed patterns on a set of wafers, measuring critical dimensions of the printed patterns, and determining a pattern whose critical dimension measurements are substantially insensitive to focus variations.

The system can then determine an optical critical-dimension value (step 706). Specifically, the system can determine multiple aerial-image-intensity values in proximity to the iso-focal pattern by convolving the layout with multiple optical models, wherein the multiple optical models model the photolithography process's optical system under different focus conditions (step 708). Next, the system can determine a first location in proximity to the iso-focal pattern where the aerial-image-intensity values are substantially insensitive to focus variations (step 710). The system can then determine the optical critical-dimension value by determining a distance between the first location and a reference location (step 712).

The reference location can generally be any location that is being used to determine the optical critical-dimension. For example, the reference location can be the center of the pattern, e.g., the center of a line. Alternatively, the reference location can be a location on the other side of the pattern where the aerial-image-intensity values are substantially insensitive to focus variations. For example, if the first location is point 420 in FIG. 4, then the reference location can either be at the "0" position or at point 412.

It will be evident that the distance between the first location and the reference location may need to be adjusted to obtain the optical critical-dimension value. For example, if the reference location is point 412, then the distance between the first location and the reference location will be the optical critical-dimension value. On the other hand, if the reference location is at the "0" position, then, assuming that the "0" position is at the center of line 404, the distance between the first location and the reference location may need to be doubled to obtain the optical critical-dimension value.

Next, the system can determine the resist bias by determining a difference between the resist critical-dimension value and the optical critical-dimension value (step 714). The system can then store the resist bias (step 716).

The resist bias and/or the optical threshold can be used to determine a photolithography process model for the photolithography process. Specifically, the resist bias and/or the optical threshold can be used to determine a physical model for the resist. The photolithography process model can be used to perform optical proximity correction or to predict a contour of a printed pattern on a wafer.

Figure 8:
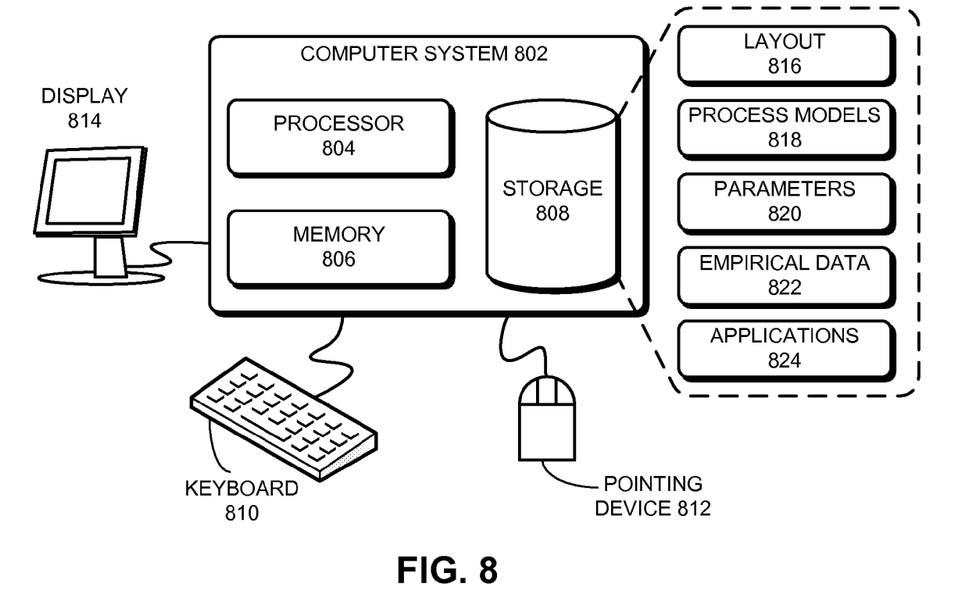
FIG. 8 illustrates a computer system in accordance with an embodiment of the present invention.

FIG. 8 illustrates a computer system in accordance with an embodiment of the present invention.

Computer system 802 comprises processor 804, memory 806, and storage device 808. Computer system 802 can be coupled with display 814, keyboard 810, and pointing device 812. Storage device 808 can store layout 816, process models 818, parameters 820, empirical data 822, and applications 824.

Empirical data 822 can include critical dimension measurements of features that were printed on a wafer's surface when layout 816 was subjected to a photolithography process. Applications 824 can include instructions which when executed by processor 804 cause computer system 802 to perform a method for determining an optical threshold and/or to perform a method for determining a resist bias.

During operation, computer system 802 can load applications 824 in memory 806. Next, the system can use empirical data 822 to determine the iso-focal pattern and the resist critical-dimension. The system can then use layout 816 and process models 818 to determine the optical threshold and the optical critical-dimension. Next, the system can determine the resist bias. The system can then store the computed parameters, such as the optical threshold and the resist bias, in storage 808.

The system can then use the optical threshold and the resist bias to determine a photolithography process model. The system can store the process model on storage 808 by storing the associated parameters and/or coefficients in a computer-readable storage medium. Specifically, in one embodiment, the system can store the process model by storing parameters, coefficients, kernel identifiers, and information that associates the parameters and coefficients with their respective kernel identifiers. A kernel identifier can be a string that identifies a kernel, or it can be an expression that represents the kernel. Next, the system can use a process model to determine a proximity correction or to predict the shape of a printed pattern.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a parameter for a photolithography process, the method comprising:
receiving a layout;
determining a resist critical-dimension value by measuring a critical dimension of an iso-focal pattern as printed on a wafer, wherein the critical dimension is substantially insensitive to focus variations;
determining an optical critical-dimension value by:
determining multiple aerial-image-intensity values in proximity to the iso-focal pattern by convolving the layout with multiple optical models, wherein the multiple optical models model the photolithography process's optical system under different focus conditions;
determining a first location in proximity to the iso-focal pattern where the aerial-image-intensity values are substantially insensitive to focus variations; and
determining the optical critical-dimension value by determining a distance between the first location and a reference location;
determining a resist bias for the photolithography process by determining a difference between the resist critical-dimension value and the optical critical-dimension value; and
storing the resist bias.

2. The method of claim 1, comprising:
identifying the iso-focal pattern in the layout by:
printing the layout under different focus conditions to obtain printed patterns on a set of wafers;
measuring critical dimensions of the printed patterns; and
determining a pattern whose critical dimension measurements are substantially insensitive to focus variations.

3. The method of claim 1, wherein the resist bias is used to determine a photolithography process model for the photolithography process.

4. The method of claim 3, wherein the photolithography process model is used to perform optical proximity correction.

5. The method of claim 3, wherein the photolithography process model is used to predict a contour of a printed pattern on a wafer.

6. A computer-readable storage medium storing instructions that when executed by a computer cause the computer to perform a method for determining a parameter for a photolithography process, the method comprising:
receiving a layout;
determining a resist critical-dimension value by measuring a critical dimension of an iso-focal pattern as printed on a wafer, wherein the critical dimension is substantially insensitive to focus variations;
determining an optical critical-dimension value by:
determining multiple aerial-image-intensity values in proximity to the iso-focal pattern by convolving the layout with multiple optical models, wherein the multiple optical models model the photolithography process's optical system under different focus conditions;
determining a first location in proximity to the iso-focal pattern where the aerial-image-intensity values are substantially insensitive to focus variations; and
determining the optical critical-dimension value by determining a distance between the first location and a reference location;
determining a resist bias for the photolithography process by determining a difference between the resist critical-dimension value and the optical critical-dimension value; and
storing the resist bias.

7. The computer-readable storage medium of claim 6, wherein the method comprises:
identifying the iso-focal pattern in the layout by:
printing the layout under different focus conditions to obtain printed patterns on a set of wafers;
measuring critical dimensions of the printed patterns; and
determining a pattern whose critical dimension measurements are substantially insensitive to focus variations.

8. The computer-readable storage medium of claim 6, wherein the resist bias is used to determine a photolithography process model for the photolithography process.

9. The computer-readable storage medium of claim 8, wherein the photolithography process model is used to perform optical proximity correction.

10. The computer-readable storage medium of claim 8, wherein the photolithography process model is used to predict a contour of a printed pattern on a wafer.

11. A method for determining a parameter for a photolithography process, the method comprising:
receiving a layout, wherein the layout includes patterns which are to be printed;
determining an iso-focal pattern in the layout by:
printing the layout under different focus conditions; and
determining a printed pattern such that a critical dimension of the printed pattern is substantially insensitive to focus variations;
using the iso-focal pattern to determine an optical threshold for the photolithography process by:
determining multiple aerial-image-intensity values by convolving the layout with multiple optical models, wherein the multiple optical models model the photolithography process's optical system under different focus conditions;

determining a first location in proximity to the iso-focal pattern where the aerial-image-intensity values are substantially insensitive to focus variations; and determining the optical threshold's value using the aerial-image-intensity values at the first location; and storing the optical threshold's value.

12. The method of claim 11, comprising:

determining a resist bias for the photolithography process by:

determining a resist critical-dimension value by measuring a critical dimension of the iso-focal pattern as printed on a wafer;

determining an optical critical-dimension value by determining a distance between the first location and a reference location; and determining the resist bias by determining a difference between the resist critical-dimension value and the optical critical-dimension value.

13. The method of claim 11, wherein the optical threshold value is used to determine a photolithography process model for the photolithography process.

14. The method of claim 13, wherein the photolithography process model is used to perform optical proximity correction.

15. The method of claim 13, wherein the photolithography process model is used to predict a contour of a printed pattern on a wafer.

16. A computer-readable storage medium storing instructions that when executed by a computer cause the computer to perform a method for determining a parameter for a photolithography process, the method comprising:

receiving a layout, wherein the layout includes patterns which are to be printed;

determining an iso-focal pattern in the layout by:

printing the layout under different focus conditions; and determining a printed pattern such that a critical dimension of the printed pattern is substantially insensitive to focus variations;

using the iso-focal pattern to determine an optical threshold for the photolithography process by:

determining multiple aerial-image-intensity values by convolving the layout with multiple optical models, wherein the multiple optical models model the photolithography process's optical system under different focus conditions;

determining a first location in proximity to the iso-focal pattern where the aerial-image-intensity values are substantially insensitive to focus variations; and determining the optical threshold's value using the aerial-image-intensity values at the first location; and storing the optical threshold's value.

17. The computer-readable storage medium of claim 16, wherein the method comprises:

determining a resist bias for the photolithography process by:

determining a resist critical-dimension value by measuring a critical dimension of the iso-focal pattern as printed on a wafer;

determining an optical critical-dimension value by determining a distance between the first location and a reference location; and determining the resist bias by determining a difference between the resist critical-dimension value and the optical critical-dimension value.

18. The computer-readable storage medium of claim 16, wherein the optical threshold value is used to determine a photolithography process model for the photolithography process.

19. The computer-readable storage medium of claim 18, wherein the photolithography process model is used to perform optical proximity correction.

20. The computer-readable storage medium of claim 18, wherein the photolithography process model is used to predict a contour of a printed pattern on a wafer.

* * * * *